(12) United States Patent
Cho et al.

(10) Patent No.: US 10,748,943 B2
(45) Date of Patent: Aug. 18, 2020

(54) DISPLAY DEVICE, MANUFACTURING METHOD THEREOF, AND ELECTRODE FORMING METHOD

(71) Applicant: SAMSUNG DISPLAY CO., LTD., Yongin-si, Gyeonggi-do (KR)

(72) Inventors: Hyun Min Cho, Yongin-si (KR); Shin Il Choi, Yongin-si (KR); Kyeong Su Ko, Yongin-si (KR); Sang Gab Kim, Yongin-si (KR); Joon Geol Lee, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/124,356

(22) Filed: Sep. 7, 2018

(65) Prior Publication Data
US 2019/0081088 A1    Mar. 14, 2019

(30) Foreign Application Priority Data
Sep. 8, 2017   (KR) .................. 10-2017-0115082

(51) Int. Cl.
*H01L 27/12*   (2006.01)
*H01L 29/45*   (2006.01)
(Continued)

(52) U.S. Cl.
CPC .... *H01L 27/1251* (2013.01); *H01L 21/32136* (2013.01); *H01L 27/1225* (2013.01);
(Continued)

(58) Field of Classification Search
CPC . H01L 27/1251; H01L 27/1255; H01L 51/50; H01L 29/7869
See application file for complete search history.

(56) References Cited

U.S. PATENT DOCUMENTS 8,212,254 B2   7/2012  Miyairi
8,513,652 B2   8/2013  Ko et al.
(Continued)

FOREIGN PATENT DOCUMENTS

| KR | 10-1108160 B1 | 1/2012 |
| KR | 10-1394097 B1 | 5/2014 |
| KR | 10-2015-0043134 A | 4/2015 |

*Primary Examiner* — Cuong Q Nguyen
*Assistant Examiner* — Shih Tsun A Chou
(74) *Attorney, Agent, or Firm* — Kile Park Reed & Houtteman PLLC (57) ABSTRACT

A display device includes: a substrate; first and second transistors provided on the substrate to be spaced apart from each other, the first and second transistors being electrically connected to each other; and a display unit electrically connected to the first transistor, wherein the first transistor includes a first semiconductor layer including crystalline silicon, a first gate electrode, a first source electrode, and a first drain electrode, wherein the second transistor includes a second semiconductor layer including an oxide semiconductor, a second gate electrode, a second source electrode, and a second drain electrode, wherein each of the second source electrode and the second drain electrode includes a first layer that includes molybdenum and is provided on the second semiconductor layer, a second layer that includes aluminum and is provided on the first layer, and a third layer that includes titanium and is provided on the second layer.

8 Claims, 7 Drawing Sheets

(51) Int. Cl.
  *H01L 29/786* (2006.01)
  *H01L 21/3213* (2006.01)
  *H01L 51/50* (2006.01)

(52) U.S. Cl.
  CPC ...... *H01L 27/1229* (2013.01); *H01L 27/1255* (2013.01); *H01L 27/1262* (2013.01); *H01L 29/45* (2013.01); *H01L 29/7869* (2013.01); *H01L 29/78675* (2013.01); *H01L 51/50* (2013.01)

(56) References Cited

U.S. PATENT DOCUMENTS

| | | | |
|---|---|---|---|
| 9,502,442 B2 | 11/2016 | Song et al. | |
| 2010/0270541 A1* | 10/2010 | Liu | H01L 27/1214 257/40 |
| 2013/0089940 A1* | 4/2013 | Arai | H01L 29/66969 438/34 |
| 2014/0152936 A1* | 6/2014 | Kim | H01L 29/7869 349/43 |
| 2016/0307988 A1 | 10/2016 | Kim et al. | |
| 2016/0372497 A1* | 12/2016 | Lee | H01L 27/1255 |
| 2016/0380110 A1* | 12/2016 | Lee | H01L 29/78606 257/72 |

* cited by examiner

DISPLAY DEVICE, MANUFACTURING METHOD THEREOF, AND ELECTRODE FORMING METHOD

CROSS-REFERENCE TO RELATED APPLICATION

Korean Patent Application No. 10-2017-0115082, filed on Sep. 8, 2017, in the Korean Intellectual Property Office, and entitled: "Display Device, Manufacturing Method Thereof, and Electrode Forming Method," is incorporated by reference herein in its entirety.

BACKGROUND

1. Field

Embodiments relate to a display device, a manufacturing method thereof, and an electrode forming method.

2. Description of the Related Art

Display devices have come into the spotlight because of their light weight and thin thickness. Among the display devices, an organic light emitting display device is a self-luminescent display device that displays an image using organic light emitting diodes that emit light, and does not require any separate light source. Also, the organic light emitting display device has low power consumption, high luminance, and high speed of response, and thus has drawn attention as a next-generation display device.

The organic light emitting display device includes a plurality of pixels, each of which includes an organic light emitting diode, a plurality of transistors for driving the organic light emitting diode, and at least one capacitor.

SUMMARY

Embodiments are directed to a display device including: a substrate; first and second transistors provided on the substrate to be spaced apart from each other, the first and second transistors being electrically connected to each other; and a display unit electrically connected to the first transistor, wherein the first transistor includes a first semiconductor layer including crystalline silicon, a first gate electrode, a first source electrode, and a first drain electrode, wherein the second transistor includes a second semiconductor layer including an oxide semiconductor, a second gate electrode, a second source electrode, and a second drain electrode, wherein each of the second source electrode and the second drain electrode includes a first layer that includes molybdenum and is provided on the second semiconductor layer, a second layer that includes aluminum and is provided on the first layer, and a third layer that includes titanium and is provided on the second layer.

The display device may further include: a first insulating layer provided between the first semiconductor layer and the first gate electrode; a second insulating layer provided over the first gate electrode; and a capacitor electrode provided on the second insulating layer, the capacitor electrode overlapping with the first gate electrode.

The display device may further include a third insulating layer provided between the second semiconductor layer and the second gate electrode. The second source electrode and the second drain electrode may be provided on the third insulating layer.

The first source electrode and the first drain electrode may be provided on the third insulating layer. Each of the first source electrode and the first drain electrode may include a first layer provided on the third insulating layer, a second layer provided on the first layer, and a third layer provided on the second layer.

The display device may further include an aluminum oxide ($Al_xO_y$) layer provided at a side part of the second layer.

The display unit may include: a first electrode electrically connected to the first drain electrode; a second electrode provided on the first electrode; and an emitting layer provided between the first electrode and the second electrode.

The first transistor may be a driving transistor, and the second transistor may be a switching transistor.

Embodiments are also directed to a method of manufacturing a display device, the method including: providing a first semiconductor layer including crystalline silicon on a substrate; providing a first insulating layer over the first semiconductor layer; providing a first gate electrode on the first insulating layer; providing a second insulating layer over the first gate electrode; providing a second gate electrode spaced apart from the first gate electrode on the second insulating layer; providing a third insulating layer over the second gate electrode; providing a second semiconductor layer including an oxide semiconductor on the third insulating layer; and providing a first source electrode and a first drain electrode, which are connected to the first semiconductor layer, and a second source electrode and a second drain electrode, which are connected to the second semiconductor layer, wherein the providing of the first source electrode, the first drain electrode, the second source electrode, and the second drain electrode includes: sequentially providing a first layer that includes molybdenum, a second layer that includes aluminum and is provided on the first layer, and a third layer that includes titanium and is provided on the second layer; a first etching process of etching the second layer and the third layer together; and a second etching process of etching the first layer.

The first etching process and the second etching process may be performed using a dry etching method.

A fluid for etching, which is used in the first etching process, may include chloride ($Cl_2$) and boron trichloride ($BCL_3$), and a fluid for etching which is used in the second etching process, may include chloride ($Cl_2$) and oxygen ($O_2$).

The fluid for etching, which is used in the first etching process, may form an aluminum oxide ($Al_xO_y$) layer at a side part of the second layer by reacting with the second layer.

The method may further include providing a capacitor electrode that is provided on the second insulating layer, overlaps with the first gate electrode, and is simultaneously formed with the second gate electrode.

Embodiments are also directed to a method of forming an electrode, the method including: sequentially forming a first layer that includes molybdenum, a second layer that includes aluminum and is provided on the first layer, and a third layer that includes titanium and is provided on the second layer; a first etching process of etching the second layer and the third layer together; and a second etching process of etching the first layer, wherein the first layer is provided on an oxide semiconductor.

The first etching process and the second etching process may be performed using a dry etching method.

A fluid for etching, which is used in the first etching process, may include chloride ($Cl_2$) and boron trichloride ($BCL_3$), and a fluid for etching which is used in the second etching process, may include chloride ($Cl_2$) and oxygen ($O_2$).

The fluid for etching, which is used in the first etching process, may form an aluminum oxide ($Al_xO_y$) layer at a side part of the second layer by reacting with the second layer.

BRIEF DESCRIPTION OF THE DRAWINGS

Features will become apparent to those of skill in the art by describing in detail example embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

The present disclosure may apply various changes and different shape, therefore only illustrate in details with particular examples. However, the examples do not limit to certain shapes but apply to all the change and equivalent material and replacement.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, example embodiments will be described in detail with reference to the accompanying drawings.

Figure 1:
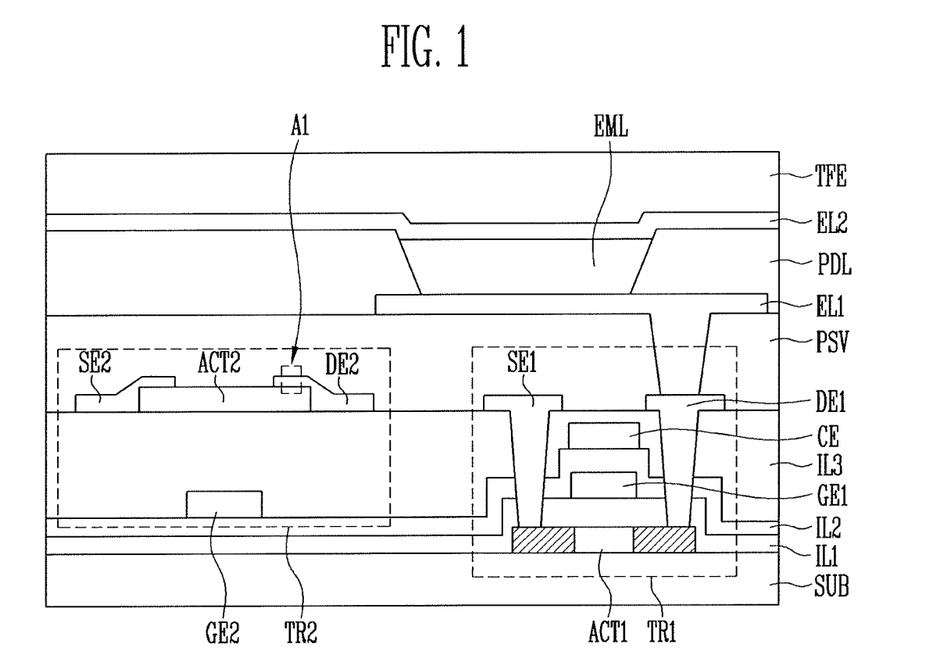
FIG. 1 illustrates a sectional view of a display device according to an embodiment.
Figure 2:
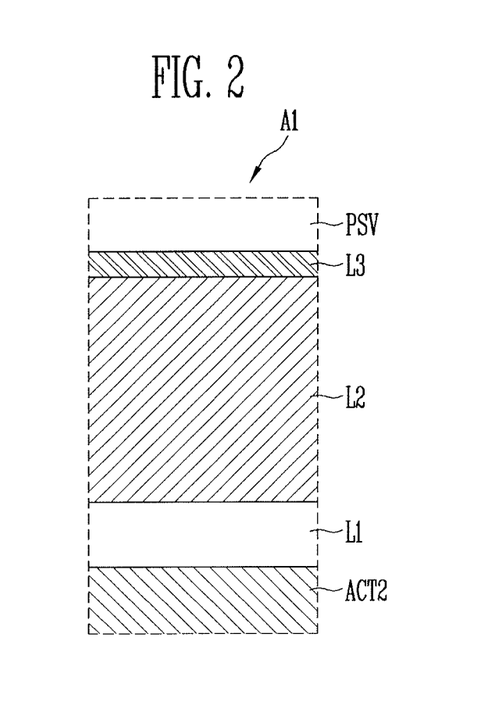
FIG. 2 illustrates an enlarged sectional view illustrating portion A1 of FIG. 1.

FIG. 1 is a sectional view of a display device according to an embodiment. FIG. 2 is an enlarged sectional view illustrating portion A1 of FIG. 1. Hereinafter, the display device according to the embodiment will be described with reference to FIGS. 1 and 2.

Referring to FIG. 1, the display device includes a substrate SUB, a first transistor TR1 and a second transistor TR2, which are provided on the substrate SUB to be spaced apart from each other, and a display unit electrically connected to the first transistor TR1.

Hereinafter, each component included in the display device will be described in more detail.

The substrate SUB on which the first transistor TR1 and the second transistor TR2 are provided may include a transparent insulating material to enable light to be transmitted therethrough. The substrate SUB may be a rigid substrate. For example, the substrate SUB may be any one of a glass substrate, a quartz substrate, a glass ceramic substrate, and a crystalline glass substrate.

In addition, the substrate SUB may be a flexible substrate. Here, the substrate SUB may be one of a film substrate and a plastic substrate, including a polymer organic material. For example, the substrate SUB may include at least one selected from the group of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material constituting the substrate SUB may be variously changed, and include a fiber reinforced plastic (FRP), etc.

The material applied to the substrate SUB may have resistance (or heat resistance) against high processing temperature in a manufacturing process of the display device.

The first transistor TR1 and the second transistor TR2 are provided on the substrate SUB.

A buffer layer may be further provided between the substrate SUB and the first transistor TR1. The buffer layer may have a single-layered or multi-layered structure. Also, the buffer layer may include at least one of an inorganic insulating material and an organic insulating material. For example, when the buffer layer has a single-layered structure of an inorganic insulating material, the buffer layer may include one of a silicon oxide layer, a silicon nitride layer, and a silicon oxynitride layer. When the buffer layer has a multi-layered structure of an inorganic insulating material, the buffer layer may have a multi-layered structure in which a silicon oxide layer and a silicon nitride layer are alternately stacked. When the buffer layer has a single-layered structure of an organic insulating material, the buffer layer may include at least one of acryl, polyimide, polyamide, and benzocyclobutene. When the buffer layer has a multi-layered structure of an organic insulating material, the buffer layer may have a structure in which the plurality of organic insulating layers including at least one of acryl, polyimide, polyamide, and benzocyclobutene are stacked. Also, the buffer layer may have a structure in which an inorganic insulating layer and an organic insulating layer are alternately stacked.

The buffer layer may prevent impurities from being diffused into the transistor, and prevents moisture and oxygen from penetrating into the transistor. Also, the buffer layer may planarize a surface of the substrate SUB. In some cases, the buffer layer may be omitted.

The first transistor TR1 is provided on the substrate SUB, and includes a first semiconductor layer ACT1 including crystalline silicon, a first gate electrode GE1 provided on the first semiconductor layer ACT1, a first insulating layer IL1 provided between the first gate electrode GE1 and the first semiconductor layer ACT1, a second insulating layer IL2 provided over the first gate electrode GE1, and a first source electrode SE1 and a first drain electrode DE1, which are provided to be spaced apart from each other and are connected to the first semiconductor layer ACT1.

The first semiconductor layer ACT1 provided on the substrate SUB includes crystalline silicon. The crystalline silicon may be single crystalline silicon and/or multi-crystalline silicon. As compared with a semiconductor layer including amorphous silicon, the first semiconductor layer ACT1 including the crystalline silicon has a high electron mobility. In the case of amorphous silicon, electron mobility may be relatively decreased due to irregular arrangement of silicon atoms.

In addition, the first semiconductor layer ACT1 may include a source region and a drain region, which are respectively in contact with the first source electrode SE1 and the first drain electrode DE1. The source region and the drain region may be doped regions. A region between the source region and the drain region may be a channel region.

The first semiconductor layer ACT1 including the crystalline silicon may be formed by crystallizing the amorphous silicon. The process of crystallizing the amorphous silicon may be performed at a high or low temperature. When the amorphous silicon is crystallized at a high temperature, the substrate SUB may be made of a heat resistance material which can endure the high-temperature process.

The method of crystallizing the amorphous silicon at a low temperature may include a solid phase crystallization (SPC) method, a metal induced crystallization (MIC) method, a metal induced lateral crystallization (MILC) method, an excimer laser crystallization (ELC) method, or the like.

The SPC method is a method of annealing the amorphous silicon at a relatively high temperature for a long time. The SPC method may be generally performed by annealing the amorphous silicon at about 600° C. to about 700° C. for about 1 hour to 24 hours.

According to the MIC method, the crystallization temperature of the amorphous silicon may be lowered by allowing the amorphous silicon to be in contact with a specific metal. Examples of the metal used herein may be nickel (Ni), palladium (Pd), titanium (Ti), aluminum (Al), gold (Au), silver (Ag), copper (Cu), cobalt (Co), iron (Fe), manganese (Mn), or the like. These metals form a eutectic phase or a silicide phase by reacting with the amorphous silicon, so that the crystallization of the amorphous silicon is accelerated.

The ELC method is a method of crystallizing the amorphous silicon by irradiating excimer later onto the amorphous silicon. The amorphous silicon has a very high absorption coefficient in an ultraviolet region to which the wavelength of the excimer laser belongs. Thus, the amorphous silicon absorbs energy of the excimer laser without loss, and accordingly may be easily melted. The melted amorphous silicon may be phase-changed into the crystalline silicon in a process of solidifying the melted amorphous silicon.

The ELC method has a short process time, and may be locally performed. Hence, the ELC method does not damage the substrate SUB. In addition, the crystalline silicon formed by the ELC method exhibits a thermodynamically stable crystalline grain structure.

The first gate electrode GE1 may be provided on the first semiconductor layer ACT1. The first gate electrode GE1 may apply an electric field onto the first semiconductor layer ACT. A current flows or does not flow in the channel region of the first semiconductor layer ACT according to the electric field applied onto the first semiconductor layer ACT1.

The first gate electrode GE1 may include a conductive material. For example, the first gate electrode GE1 may include at least one of aluminum (Al), an Al alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and an alloy thereof.

The first insulating layer IL1 may be provided between the first gate electrode GE1 and the first semiconductor layer ACT1. The first insulating layer IL1 insulates the first gate electrode GE1 and the first semiconductor layer ACT1 from each other.

The first insulating layer IL1 may have a single-layered or multi-layered structure. Also, the first insulating layer IL1 may include at least one of an inorganic insulating material and an organic insulating material. For example, when the first insulating layer IL1 has a single-layered structure of an inorganic insulating material, the first insulating layer IL1 may include one of a silicon oxide layer, a silicon nitride layer, and a silicon oxynitride layer. When the first insulating layer IL1 has a multi-layered structure of an inorganic insulating material, the first insulating layer IL1 may have a structure in which a silicon oxide layer and a silicon nitride layer are alternately stacked. When the first insulating layer IL1 has a single-layered structure of an organic insulating material, the first insulating layer IL1 may include at least one of acryl, polyimide, polyamide, and benzocyclobutene. When the first insulating layer IL1 has a multi-layered structure of an organic insulating material, the first insulating layer IL1 may have a structure in which the above-described materials are stacked in several layers. Also, the first insulating layer IL1 may also have a structure in which an inorganic insulating layer and an organic insulating layer are alternately stacked.

In addition, the capacitance of the first insulating layer IL1 may be minimized so as to minimize a parasitic capacitance that may be generated between the first gate electrode GE1 and the first source electrode SE1 and/or the first drain electrode DE1.

The second insulating layer IL2 is provided over the first gate electrode GE1. Like the first insulating layer IL1, the second insulating layer IL2 may include at least one of an inorganic insulating material and an organic insulating material. Descriptions of inorganic and organic insulating materials that may be included in the second insulating layer IL2 are the same as those of the first insulating layer IL1.

According to an embodiment, a capacitor electrode CE may be provided on the second insulating layer IL2. The capacitor electrode CE is provided to be spaced apart from the first gate electrode GE1 with the second insulating layer IL2 interposed therebetween. The capacitor electrode CE overlaps with the first gate electrode GE1 and form a capacitance. The size of the capacitor electrode CE and the thickness of the second insulating layer IL2 are adjusted, so that the capacitance may be controlled.

The capacitor electrode CE may include a conductive material. For example, the capacitor electrode CE may include at least one of aluminum (Al), an Al alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and an alloy thereof.

A third insulating layer IL3 may be provided over the capacitor electrode CE, and the first source electrode SE1 and the first drain electrode DE1 may be provided on the third insulating layer IL3. Descriptions of the third insulating layer IL3, the first source electrode SE1, and the first drain electrode DE1 will be described later.

The first source electrode SE1 and the first drain electrode DE1 may be in contact with the source region and the drain region of the first semiconductor layer ACT1 through contact holes passing through the third insulating layer IL3, the second insulating layer IL2, and the first insulating layer IL1, respectively. The source region and the drain region may be regions in which doping is performed on the first semiconductor layer ACT1.

The second transistor TR2 spaced apart from the first transistor TR1 is provided on the second insulating layer IL2.

The second transistor TR2 includes a second gate electrode GE2 provided on the second insulating layer IL2, a second semiconductor layer ACT2 that is provided on the second gate electrode GE2 and includes an oxide semiconductor, a second source electrode SE2 and a second drain electrode DE2, which are provided on the second semiconductor layer ACT2 to be spaced apart from each other, and the third insulating layer IL3 provided between the second gate electrode GE2 and the second semiconductor layer ACT2.

The second gate electrode GE2 may include a conductive material. For example, the second gate electrode GE2 may include at least one of aluminum (Al), an Al alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and an alloy thereof.

The third insulating layer IL3 is provided over the second gate electrode GE2. The third insulating layer IL3 may have a single-layered or multi-layered structure. Also, the third insulating layer IL3 may include at least one of an inorganic insulating material and an organic insulating material. For example, when the third insulating layer IL3 has a single-layered structure of an inorganic insulating material, the third insulating layer IL3 may include one of a silicon oxide layer, a silicon nitride layer, and a silicon oxynitride layer. When the third insulating layer IL3 has a multi-layered structure of an inorganic insulating material, the third insulating layer IL3 may have a structure in which a silicon oxide layer and a silicon nitride layer are alternately stacked.

When the third insulating layer IL3 includes an inorganic insulating material, a silicon oxide layer may be provided at a surface of the third insulating layer IL3 that meets the second semiconductor layer ACT2. In the case of a silicon nitride layer, hydrogen may penetrate into the second semiconductor layer ACT2 in a process of forming the silicon nitride layer, using plasma-enhanced chemical vapor deposition (PECVD). Electrical characteristics of the second semiconductor layer ACT2 may be changed by the penetrating hydrogen, and hence the silicon oxide layer may be provided at the surface of the third insulating layer IL3 that meets the second semiconductor layer ACT2.

In addition, the third insulating layer IL3 may include an organic layer. When the third insulating layer IL3 has a single-layered structure of an organic insulating material, the third insulating layer IL3 may include at least one of acryl, polyimide, polyamide, and benzocyclobutene. When the third insulating layer IL3 has a multi-layered structure of an organic insulating material, the third insulating layer IL3 may have a structure in which the above-described materials are stacked in several layers.

The second semiconductor layer ACT2 is provided on the third insulating layer IL3. The second semiconductor layer ACT2 may include an oxide semiconductor. The oxide semiconductor included in the second semiconductor layer ACT2 may include at least one of one-component metal oxide such as indium (In) oxide, tin (Sn) oxide, or zinc (Zn) oxide, two-component metal oxide such as In—Zn-based oxide, Sn—Zn-based oxide, Al—Zn-based oxide, Zn—Mg-based oxide, Sn—Mg-based oxide, In—Mg-based oxide, or In—Ga-based oxide, three-component metal oxide such as In—Ga—Zn-based oxide, In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, or In—Lu—Zn-based oxide, and four-component metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, or In—Hf—Al—Zn-based oxide.

For example, the second semiconductor layer ACT2 may include indium-gallium-zinc oxide (IGZO) in the In—Ga—Zn-based oxide. In the IGZO, the electron mobility of indium (In) is increased using overlapping of orbitals, and gallium (Ga) suppresses generation of excessive carriers, so that it is possible to prevent leakage current from being generated when power is cut off. In addition, zinc (Zn) stabilizes the chemical structure of the IGZO, and oxygen (O) serves as a carrier of the second semiconductor layer ACT2. Thus, the second semiconductor layer ACT2 including the IGZO has a high electron mobility and is stable.

The oxide semiconductor included in the second semiconductor layer ACT2 is a compound semiconductor formed by ionic bonding of a positive ion of a metal and a negative ion of oxygen. Accordingly, the main component of conduction band minimum (CBM) of the oxide semiconductor is an S orbital of the metal constituting the oxide semiconductor, and the main component of valence band maximum (VBM) is a p orbital.

Major carriers of the oxide semiconductor are electrons, and the oxide semiconductor is of an n-type. Electrical characteristics of the oxide semiconductor relay on the vacancy of oxygen and the concentration of hydrogen doped into the oxide semiconductor during a process. In particular, the hydrogen has influence on the carrier concentration of the oxide semiconductor.

An etch stop layer may be further provided on the second semiconductor layer ACT2. The etch stop layer may be provided on the second semiconductor layer ACT2, to prevent the second semiconductor layer ACT2 from being deteriorated in the manufacturing process of the display device.

The display device according to the present example embodiment includes the first transistor TR1 and the second transistor TR2, which are spaced apart from each other. The first transistor TR1 includes the first semiconductor layer ACT including crystalline silicon, and the second transistor TR2 includes the second semiconductor layer ACT2 including an oxide semiconductor.

According to the present example embodiment, the transistors TR1 and TR2 including the semiconductor layers ACT1 and ACT2 formed of different materials are provided on the substrate to be spaced apart from each other, so that it is possible to simultaneously obtain advantages of the transistor including the oxide semiconductor and advantages of the transistor including crystalline silicon.

For example, the transistor including the crystalline silicon, which has a very high electron mobility speed in a semiconductor layer but has high processing cost, may be provided in a region required to rapidly transfer a signal. In addition, the transistor including the oxide semiconductor, which has an electron mobility speed relatively lower than that of the transistor including the crystalline silicon but has low processing cost and prevents leakage current, may be provided in a region in which leakage current may be generated.

For example, according to an embodiment, the first transistor TR1 that includes the first semiconductor layer ACT1 including the crystalline silicon may serve as a driving transistor. In addition, the second transistor TR2 that includes the second semiconductor layer ACT2 including the oxide semiconductor may serve as a switching transistor. However, the above-described functions of the first transistor TR1 and the second transistor TR2 are merely illustrative.

In addition, although only the first transistor TR1 and the second transistor TR2 of the display device are illustrated in FIG. 1, a larger number of transistors and capacitors may be included in the display device, if necessary. For example, the display device may include seven transistors and one capacitor. However, even when the display device includes two or more transistors, at least one transistor includes a semiconductor layer including an oxides semiconductor, and at least one transistor includes a semiconductor layer including crystalline silicon.

The second source electrode SE2 and the second drain electrode DE2, which are spaced apart from each other, are provided on the second semiconductor layer ACT2.

As shown in FIG. 2, each of the second source electrode SE2 and the second drain electrode DE2 includes a first layer L1 that includes molybdenum and is provided on the second semiconductor layer ACT2, a second layer L2 that includes aluminum and is provided on the first layer L1, and a third layer L3 that includes titanium and is provided on the second layer L2.

Therefore, each of the second source electrode SE2 and the second drain electrode DE2 according to the present example embodiment may have a form in which molybdenum/aluminum/titanium are sequentially stacked. However, in addition to the above-described first to third layers L1 to L3, another layer may be further included in the second source electrode SE2 or the second drain electrode DE2. For example, a layer including another metal may be provided between the first layer L1 and the second layer L2 or between the second layer L2 and the third layer L3.

The first layer L1 includes molybdenum. Here, that the first layer L1 includes molybdenum may include not only a case where the first layer L1 is purely made of molybdenum but also a case where the first layer L1 is made of an alloy including molybdenum. However, the content of molybdenum in the alloy including molybdenum is higher than those of other metals.

The second layer L2 includes aluminum, and the third layer L3 includes titanium. Similarly, that the second layer L2 and the third layer L3 respectively include aluminum and titanium may include not only a case where each layer is purely made of aluminum or titanium but also a case where each layer is made of an alloy including aluminum or titanium. However, in this case, the content of aluminum in the alloy constituting the second layer L2 is higher than those of other metals, and the content of titanium in the alloy constituting the third layer L3 is higher than those of other metals.

The first layer L1 including molybdenum is in contact with the second semiconductor layer ACT2 including an oxide semiconductor. As the first layer L1 includes molybdenum, a contact resistance between the first layer L1 and the second semiconductor layer ACT2 can decrease. For example, since a band-offset between the molybdenum included in the first layer L1 and the oxide semiconductor included in the second semiconductor layer ACT2 is relatively small, the contact resistance between the two components can decrease.

In addition, as the first layer L1 includes molybdenum, a threshold voltage of the second semiconductor layer ACT2 may be uniformly maintained. Here, the threshold voltage is the magnitude of a voltage applied to the second gate electrode GE2, and a current can flow through the second semiconductor layer ACT2 when a voltage higher than the threshold voltage is applied to the second gate electrode GE2.

In general, when a metal having an ionization tendency higher than that of a metal oxide included in an oxide semiconductor is in contact with the oxide semiconductor, the metal may be oxidized. For example, when a metal having an ionization tendency higher than that of indium (In) is in contact with an oxide semiconductor including $In_2O_3$, the metal may be oxidized as follows. In this case, the threshold voltage of a semiconductor layer including the oxide semiconductor may be changed by generation of a metal oxide.

$$M+In_2O_3 \rightarrow MO_x+In \qquad \text{Chemical Formula 1}$$

(M is an arbitrary metal)

The ionization tendency of molybdenum is lower than that of a metal included in the oxide semiconductor. Therefore, the molybdenum is oxidized by contact of the molybdenum with the oxide semiconductor, and accordingly, it is less likely that the threshold voltage of the second semiconductor layer ACT2 including the oxide semiconductor will be changed.

The second layer L2 including aluminum is provided on the first layer L1 including molybdenum. The second layer L2 including aluminum has a high electrical conductivity. Therefore, the second layer L2 may be formed thickest among the first to third layers L1 to L3 so as to improve the electrical conductivity of the second source electrode SE2 and the second drain electrode DE2.

An aluminum oxide ($Al_xO_y$) layer may be provided at a side portion of the second layer L2 including aluminum. For example, the aluminum oxide layer may be provided in a shape forming an outer wall at the side portion of the second layer L2. The aluminum oxide layer may be formed on a surface of the second layer L2 by reacting with a fluid for etching, which is used to etch the first layer L1. Also, the aluminum oxide layer has a low reactivity with chloride mainly used to etch the first layer L1. Thus, it is less likely that the outer wall including the aluminum oxide layer of the second layer L2 will be etched together with the first layer L1 in a second etching process of etching the first layer L1. Accordingly, the shape of the second layer L2 may be maintained even after the second etching process.

The third layer L3 may be provided on the second layer L2. The third layer L3 includes titanium. The thickness of the third layer L3 may be smaller than that of the second layer L2. The third layer L3 including titanium prevents hydrogen from being diffused into the second active layer ACT2. Since the hydrogen has influence on the carrier concentration of the second semiconductor layer ACT2 including the oxide semiconductor, it is preferable to prevent the hydrogen from being unnecessarily injected into the second semiconductor layer ACT2 during a process.

Referring to FIG. 1, the first source electrode SE1 and the first drain electrode DE1 are provided in the same layer as the second source electrode SE2 and the second drain electrode DE2. Accordingly, like the second source electrode SE2 and the second drain electrode DE2, each of the first source electrode SE1 and the first drain electrode DE1 may include first to third layer L1 to L3. However, the form of each of the first source electrode SE1 and the first drain electrode DE1 is not limited thereto. Therefore, in some cases, the first source electrode SE1 and the first drain electrode DE1 may be provided in a layer different from that of the second source electrode SE2 and the second drain electrode DE2. In this case, each of the first source electrode SE1 and the first drain electrode DE1 may not include the above-described first to third layers L1 to L3.

A protective layer PSV is provided over the first source electrode SE1, the first drain electrode DE1, the second source electrode SE2, and the second drain electrode DE2. The protective layer PSV covers the first transistor TR1 and the second transistor TR2. The protective layer PSV may include at least one of an inorganic insulating layer made of an inorganic material and an organic insulating layer made of an organic material.

A first electrode EL1, an emitting layer EML, and a second electrode EL2 are provided on the protective layer PSV. The first electrode EL1, the emitting layer EML, and the second electrode EL2 may constitute a light emitting device that performs a function of receiving a signal applied to the first transistor TR1 to emit light.

Any one of the first electrode EL1 and the second electrode EL2 may be an anode electrode, and the other of the first electrode EL1 and the second electrode EL2 may be a cathode electrode. For example, when the first electrode EL1 may be an anode electrode and the second electrode EL2 may be a cathode electrode. When the light emitting device is a top emission type organic light emitting device, the first electrode EL1 may be a reflective electrode, and the second electrode EL2 may be a transmissive electrode. In the embodiment, a case where the light emitting device is a top emission type organic light emitting device, and the first electrode EL1 is an anode electrode will be described as an example.

The first electrode EL1 may be electrically connected to the first drain electrode DE1 of the first transistor TR1 through a contact hole passing through the protective layer PSV. The first electrode EL1 may include a reflective layer capable of reflecting light and a transparent conductive layer disposed on the top or bottom of the reflective layer. At least one of the transparent conductive layer and the reflective layer may be electrically connected to the first drain electrode DE1.

A pixel defining layer PDL having an opening that allows a portion of the first electrode EL1, e.g., a top surface of the first electrode EL1 to be exposed therethrough may be further provided on the protective layer PSV.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, and silane based resin.

The emitting layer EML may be provided on the exposed surface of the first electrode EL1.

The emitting layer EML may include a low-molecular or high-molecular material. In an embodiment, the low-molecular material may include copper phthalocyanine (CuPc), N,N'-Di(naphthalene-1-yl)-N,N'-diphenyl-benzidine (NPB), tris-8-hydroxyquinoline aluminum (Alq3), or the like. The high-molecular material may include poly(3,4-ethylenedioxythiophene) (PEDOT)-, poly(phenylene-vinylene) (PPV)-, and/or poly(fluorine)-based materials.

The emitting layer EML may be provided as a single layer, but may be provided as a multi-layer including various functional layers. When the emitting layer EML is provided as a multi-layer, the emitting layer EML may have a structure in which a hole injection layer, a hole transport layer, a light generation layer, an electron transport layer, an electron injection layer, or the like are stacked in a single or complex structure. The form of the emitting layer EML is not limited thereto. The emitting layer ELM may have various structures in addition to the above-described structure. In addition, at least a portion of the emitting layer ELM may be integrally formed throughout a plurality of first electrodes EL1, or be individually provided to correspond to each of the plurality of first electrodes EL1. The color of light generated in the emitting layer EML may be one of red, green, blue, and white, but the present example embodiment is not limited thereto. For example, the color of light generated in a light generation layer of the emitting layer EML may be one of magenta, cyan, and yellow.

The second electrode EL2 may be provided on the emitting layer EML. The second electrode EL2 may be a semi-transmissive reflective layer. For example, the second electrode EL2 may be a thin metal layer having a thickness, through which light emitted through the emitting layer EML may be transmitted. The second electrode EL2 may allow a portion of the light emitted from the emitting layer EML to be transmitted therethrough, and allow the rest of the light emitted from the emitting layer EML to be reflected therefrom.

An encapsulation layer TFE may be provided on the light emitting device.

The encapsulation layer TFE may be formed in a single layer, but be formed in a multi-layer. The encapsulation layer TFE may include a plurality of insulating layers that cover the light emitting device. For example, the encapsulation layer TFE may include a plurality of inorganic layers and a plurality of organic layers. For example, the encapsulation layer TFE may have a structure in which inorganic and organic layers are alternately stacked. In some cases, the encapsulation layer TFE may be an encapsulation substrate that is disposed on the light emitting device and is joined with the substrate SUB through a sealant.

Although not shown in the drawings, an input sensing unit may be provided on the encapsulation layer TFE. The input sensing unit includes a plurality of sensing electrodes, and senses an input such as a touch of a user. The encapsulation layer TFE may serve as a base layer of the input sensing unit.

Figure 3A:
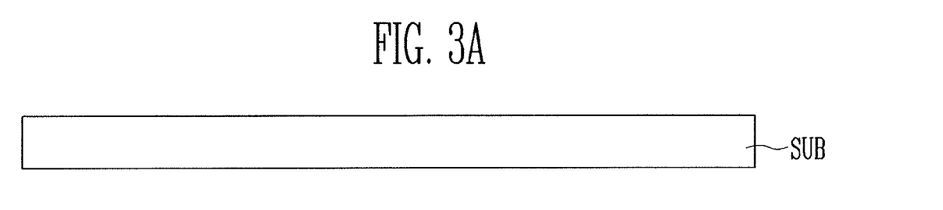
FIGS. 3A to 3Q illustrate process sectional views illustrating a manufacturing method of the display device shown in FIG. 1.
Figure 3B:
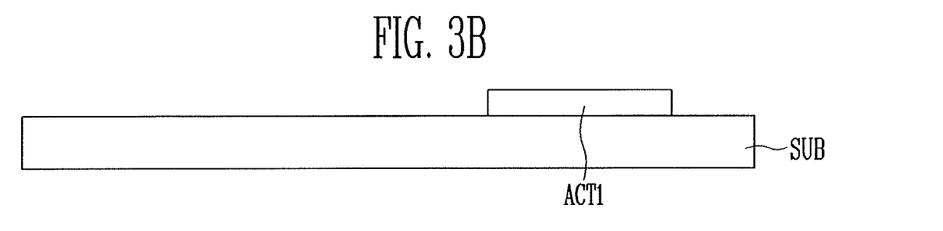
Figure 3C:
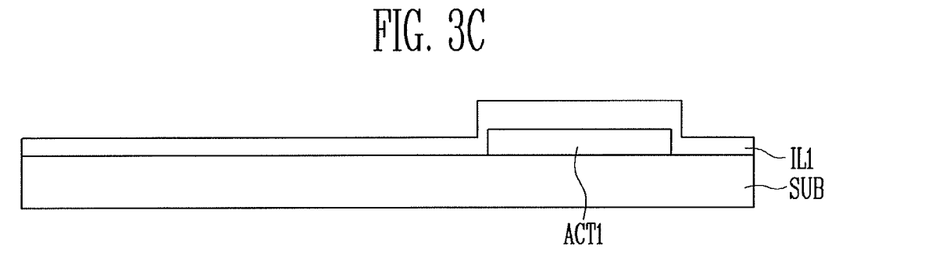
Figure 3D:
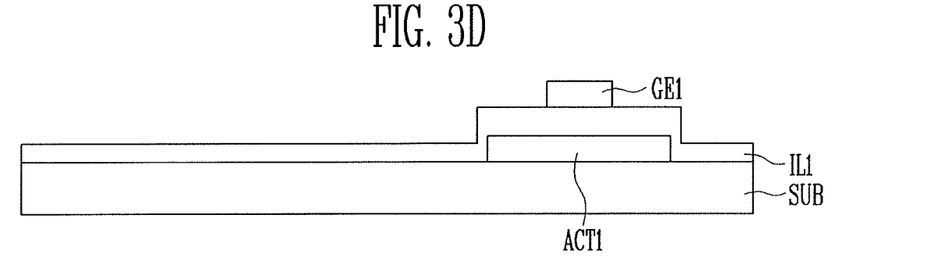
Figure 3E:
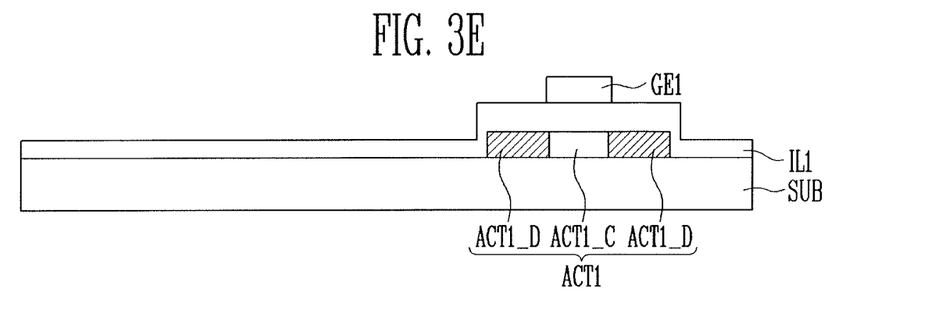
Figure 3F:
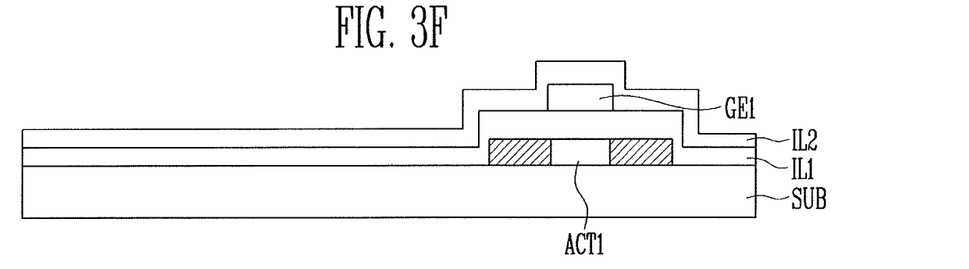
Figure 3G:
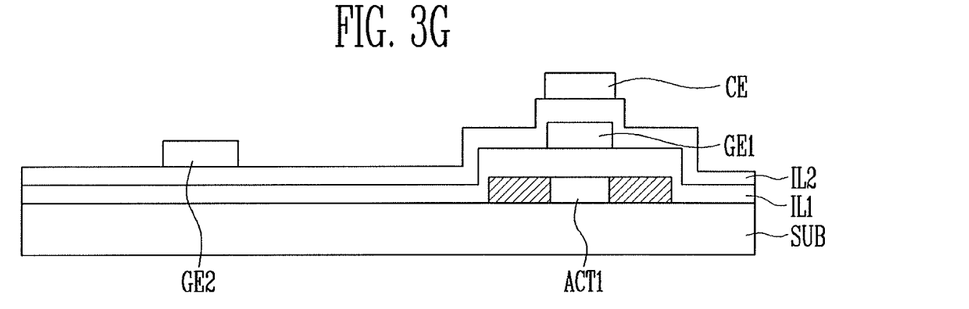
Figure 3H:
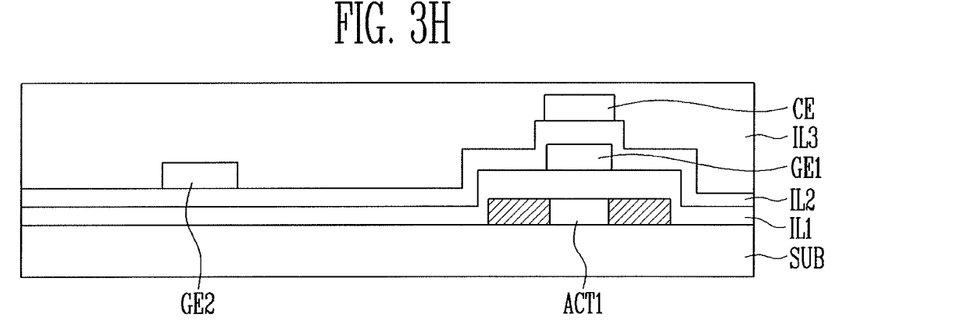
Figure 3I:
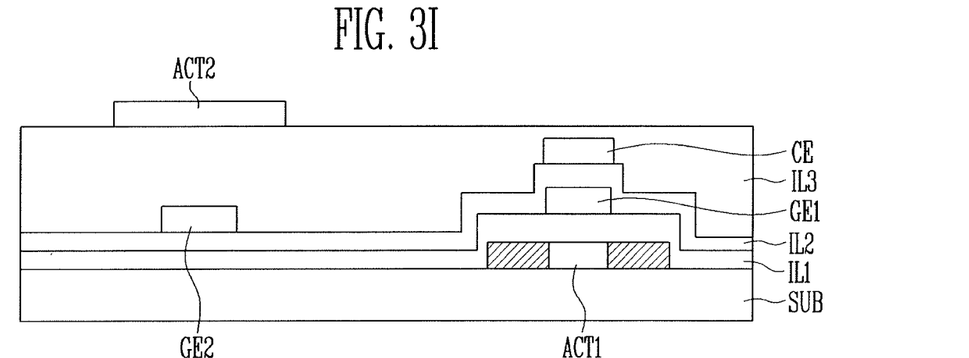
Figure 3J:
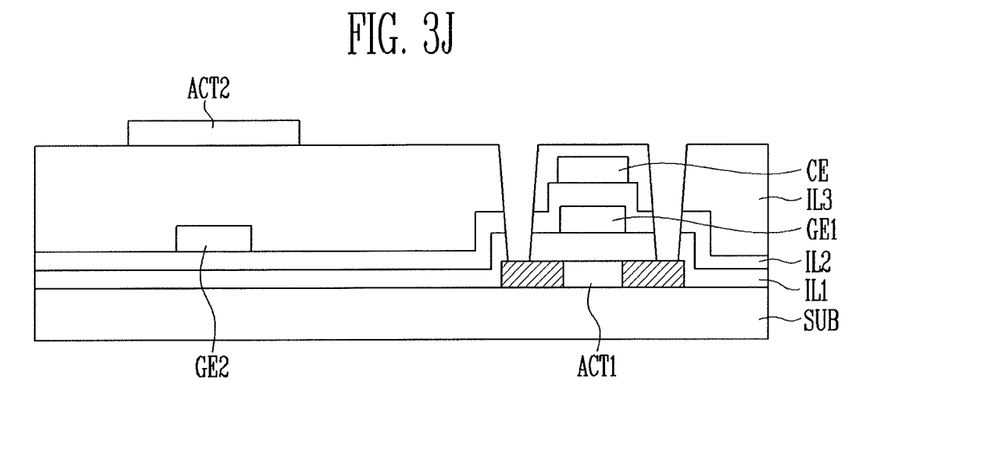
Figure 3K:
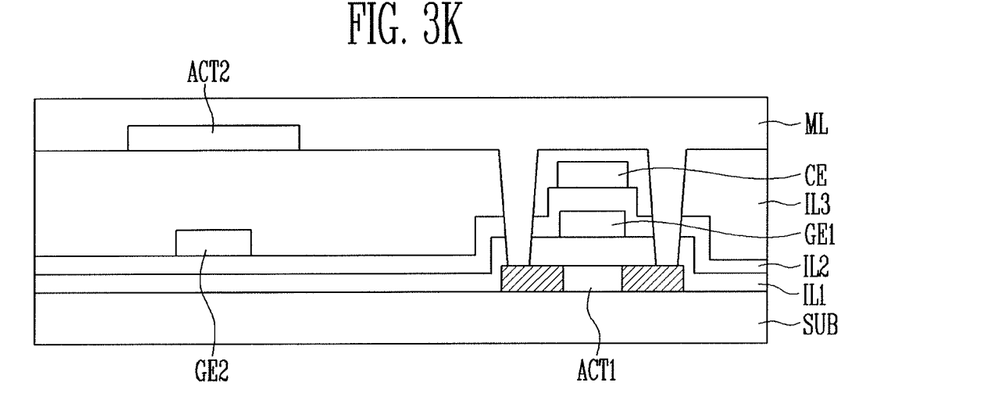
Figure 3L:
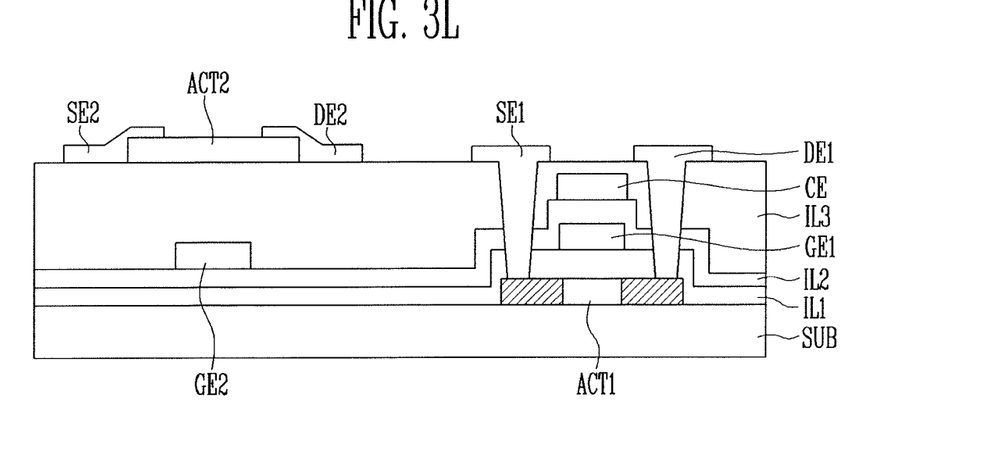
Figure 3M:
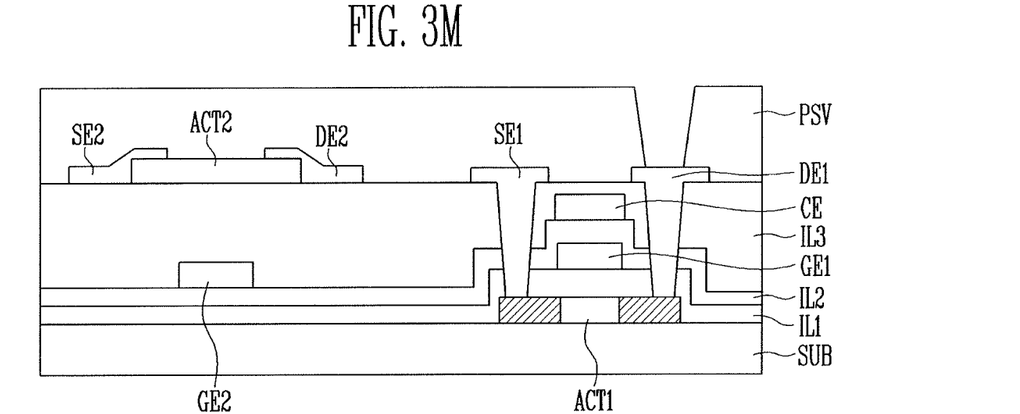
Figure 3N:
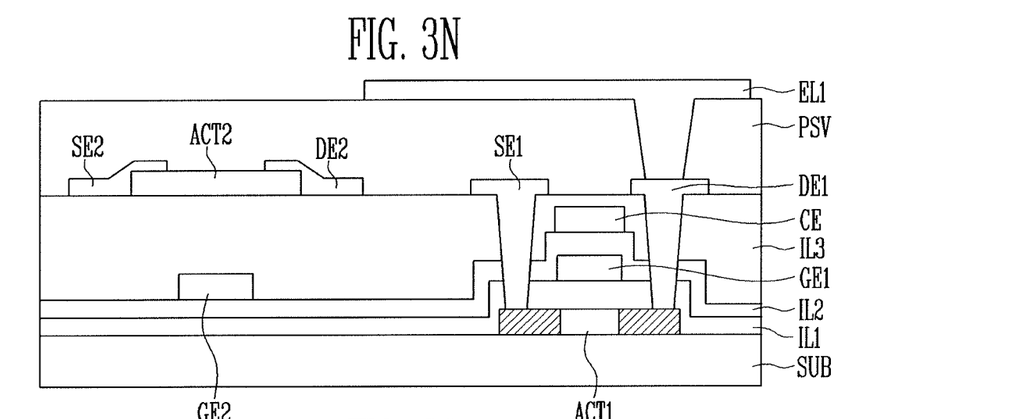
Figure 3O:
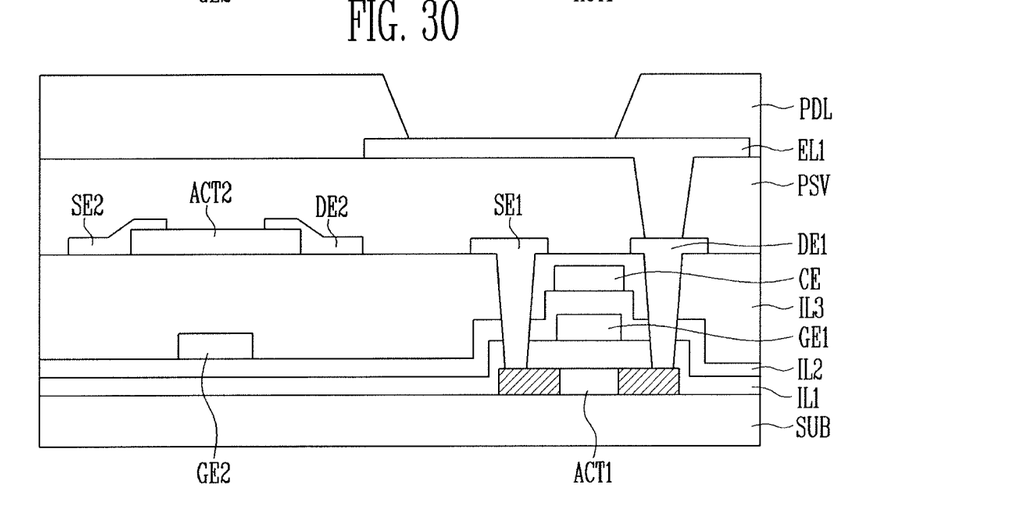
Figure 3P:
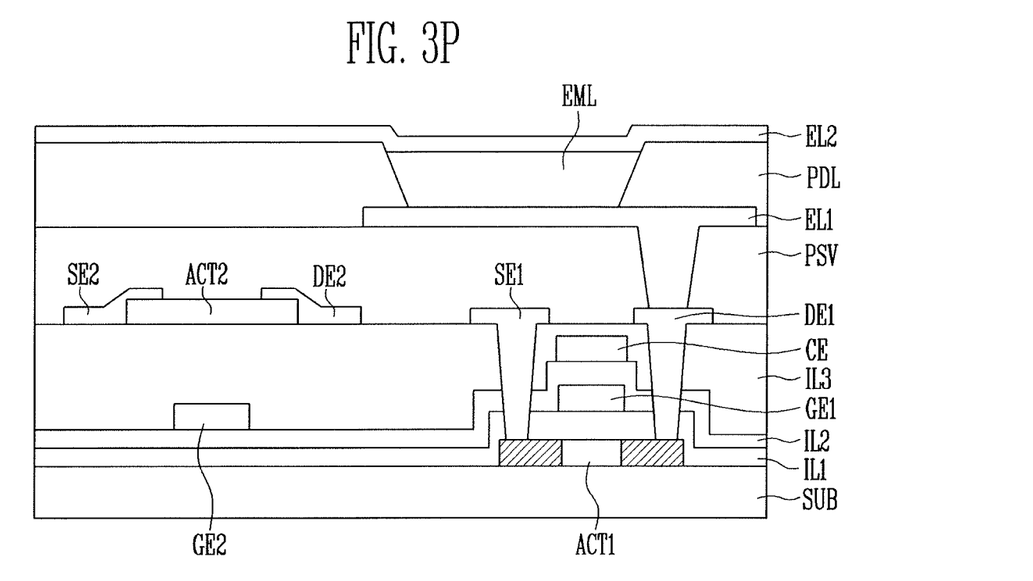
Figure 3Q:
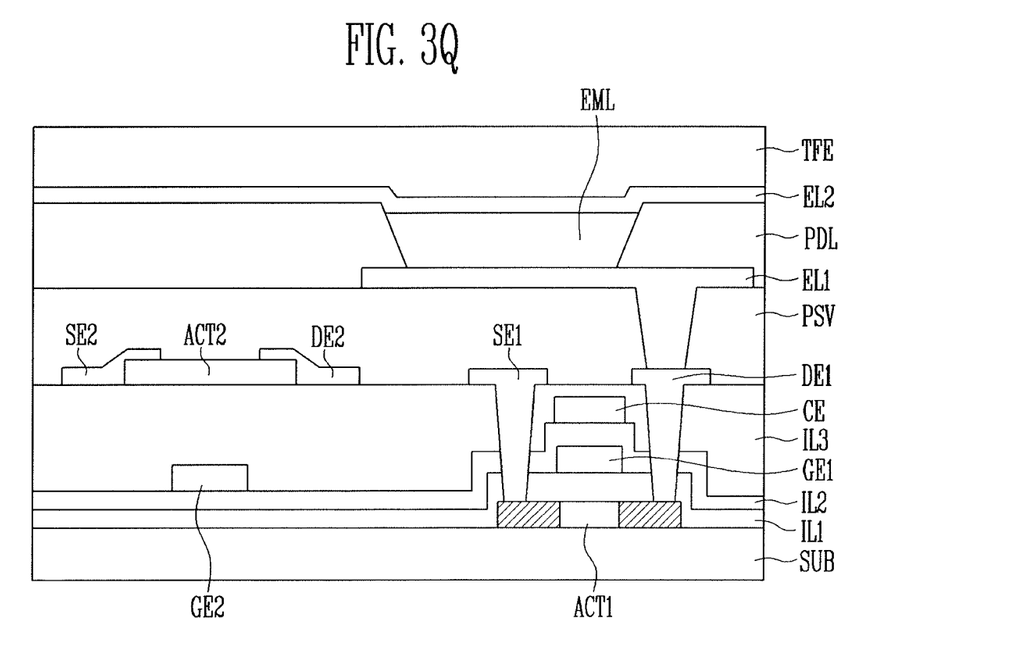

FIGS. 3A to 3Q are process sectional views illustrating a manufacturing method of the display device shown in FIG. 1.

First, referring to FIG. 3A, a substrate SUB is provided in the manufacturing of the display device according to the present example embodiment. The substrate SUB may be provided in a processing apparatus for performing a manufacturing process of the display device, such as a deposition chamber.

Referring to FIG. 3B, a first semiconductor layer ACT1 including crystalline silicon is provided on the substrate SUB. As described above, the first semiconductor layer ACT1 may be formed by crystallizing amorphous silicon. In order to crystallize amorphous silicon, there may be used a solid phase crystallization (SPC) method, a metal induced crystallization (MIC) method, a metal induced lateral crystallization (MILC) method, an excimer laser crystallization (ELC) method, or the like.

The first semiconductor layer ACT1 may be formed by entirely stacking amorphous silicon on the substrate SUB, crystallizing the amorphous silicon, and then patterning the amorphous silicon. However, in some cases, the amorphous silicon is first patterned and then crystallized.

The amorphous silicon may be stacked on the substrate SUB, using a sputtering method, a plasma enhanced chemical vapor deposition (PECVD) method, a pulsed laser deposition (PLD) method, an atomic layer deposition (ALD) method, a metal organic chemical vapor deposition (MOCVD) method, a solution process of forming a thin film by spin-coating a soluble precursor and then heat treatment on the soluble precursor, a mist CVD method of forming a thin film by spraying a soluble precursor in a mist form, or the like.

The patterning of the crystalline silicon may be performed using a photolithography method. For example, the first semiconductor layer ACT1 may be formed by forming, on the crystalline silicon, a photoresist mask that includes a photoresist including a photosensitive material, etching the crystalline silicon, using the photoresist mask, and then removing the photoresist mask.

Referring to FIG. 3C, a first insulating layer IL1 is provided over the first semiconductor layer ACT1. The first insulating layer IL1 may include an organic insulating material or an inorganic insulating material as described above. For example, when the first insulating layer IL1 includes an inorganic insulating material, the first insulating layer IL1 may be provided using a sputtering method or a plasma enhanced chemical vapor deposition (PECVD) method. On the other hand, when the first insulating layer IL1 includes an organic insulating material, the first insulating layer IL1 may be provided using a method such as printing or coating.

Referring to FIG. 3D, a first gate electrode GE1 on the first insulating layer IL1. The first gate electrode GE1 includes a conductive material. The first gate electrode GE1 may be formed by entirely stacking a conductive material on the first insulating layer IL1 and then patterning the conductive material. The first gate electrode GE1 may be patterned using a photolithography method. In order to form the first gate electrode GE1, the conductive material may be stacked on the first insulating layer IL1, using a sputtering method, a plasma enhanced chemical vapor deposition (PECVD) method, or the like.

Referring to FIG. 3E, the first semiconductor layer ACT1 may be doped after the first gate electrode GE1. For example, a source region ACT1_S and a drain region ACT1_D of the first semiconductor layer ACT1 may be doped. In this case, the first gate electrode GE1 may serve as a barrier for doping the first semiconductor layer ACT1. If the first semiconductor layer ACT1 is doped after the first gate electrode GE1 is formed, a region ACT1_C overlapping with the first gate electrode GE1 is not doped. Accordingly, the region that overlaps with the first gate electrode GE1 and is not doped can serve as a channel region ACT1_C of the first semiconductor layer ACT1.

Referring to FIG. 3F, a second insulating layer IL2 is provided over the first gate electrode GE1. Like the first insulating layer IL1, the second insulating layer IL2 may include at least one selected from an organic insulating material and an inorganic insulating material. An appropriate method of forming the second insulating layer IL2 may be used depending on the kind of the second insulating layer IL2.

Referring to FIG. 3G, a capacitor electrode CE and a second gate electrode GE2 are provided on the second insulating layer IL2. The capacitor electrode CE and the second gate electrode GE2 may be simultaneously formed by stacking a conductive layer on the second insulating layer IL2 and then patterning the conductive layer.

The conductive layer may include at least one of aluminum (Al), an Al alloy, silver (Ag), tungsten (W), copper (Cu), nickel (Ni), chromium (Cr), molybdenum (Mo), titanium (Ti), platinum (Pt), tantalum (Ta), neodymium (Nd), scandium (Sc), and an alloy thereof.

Referring to FIG. 3H, a third insulating layer IL3 is provided over the second gate electrode GE2 and the capacitor electrode CE. The third insulating IL3 may have a single- or multi-layered structure. Also, the third insulating layer IL3 may include at least one of an inorganic insulating material and an organic insulating material. For example, when the third insulating layer IL3 has a single-layered structure of an inorganic insulating material, the third insulating layer IL3 may include one of a silicon oxide layer, a silicon nitride layer, and a silicon oxynitride layer. When the third insulating layer IL3 has a multi-layered structure of an inorganic insulating material, the third insulating layer IL3 may have a structure in which a silicon oxide layer and a silicon nitride layer are alternately stacked.

Referring to FIG. 3I, a second semiconductor layer ACT2 is provided on the third insulating layer IL3. The second semiconductor layer ACT2 includes an oxide semiconductor. The oxide semiconductor may be provided on the third insulating layer IL3, using a sputtering method, a plasma enhanced chemical vapor deposition (PECVD) method, a pulsed laser deposition (PLD) method, an atomic layer deposition (ALD) method, a metal organic chemical vapor deposition (MOCVD) method, a solution process of forming a thin film by spin-coating a soluble precursor and then heat treatment on the soluble precursor, a mist CVD method of forming a thin film by spraying a soluble precursor in a mist form, or the like.

Referring to FIG. 3J, contact holes are formed after the third insulating layer IL3. The contact holes may allow the source region and the drain region of the first semiconductor layer ACT1 to be exposed therethrough.

Referring to FIG. 3K, a conductive layer ML is provided on the second semiconductor ACT2 and the third insulating layer IL3. The conductive layer ML may be formed by forming a lower layer including molybdenum on the second semiconductor layer ACT2 and the third insulating layer IL3, forming a middle layer including aluminum on the lower layer, and forming an upper layer including titanium on the middle layer. The lower layer, the middle layer, and the upper layer may be formed in the same chamber, using the same method, e.g., a deposition method or a sputtering method.

Referring to FIG. 3L, a first source electrode SE1, a first drain electrode DE, a second source electrode SE2, and a second drain electrode DE2 are provided by patterning the conductive layer ML. The patterning of the conductive layer ML may be performed using a photolithography method. Therefore, a photoresist is provided in regions in which the first source electrode SE1, the first drain electrode DE1, the second source electrode SE2, and the second drain electrode DE2 are to be formed on the conductive layer ML.

According to this embodiment, the first source electrode SE1, the first drain electrode DE1, the second source electrode SE2, and the second drain electrode DE2 are provided in the same layer through the same process. Accordingly, the first source electrode SE1, the first drain electrode DE1, the second source electrode SE2, and the second drain electrode DE2 can have the same structure.

For example, each of the first source electrode SE1, the first drain electrode DE1, the second source electrode SE2, and the second drain electrode DE2 may sequentially include a first layer including molybdenum, a second layer including aluminum, and a third layer include titanium.

The second source electrode SE and the second drain electrode DE2, each of which includes the first to third layers, may be patterned through a first etching process of etching the third layer and the second layer and a second etching process of etching the first layer. The patterning of the first to third layers will be described in detail below.

Referring to FIG. 3M, a protective layer PSV is provided, which covers the first and second source electrodes SE1 and SE2 and the first and second drain electrodes DE1 and DE2. The protective layer PSV may include an opening that allows a portion of the first drain electrode DE1 to be exposed therethrough.

Referring to FIG. 3N, a first electrode EL1 is provided on the protective layer PSV. The first electrode EL1 may be in contact with the first drain electrode DE1 through the opening. The first electrode EL1 includes a conductive material. The first electrode EL1 may be formed by entirely coating a conductive material on the protective layer PSV and then patterning the conductive material.

Referring to FIG. 3O, a pixel defining layer PDL is provided on the first electrode EL1. The pixel defining layer PDL may be provided to allow at least a portion of the first electrode EL1 to be exposed therethrough.

Referring to FIG. 3P, an emitting layer EML may be provided on the exposed first electrode EL1, and a second electrode EL2 may be provided on the pixel defining layer PDL and the emitting layer EML. The emitting layer EML may be provided on the first electrode EL1, using a method such as deposition. When the emitting layer EML includes various functional layers including a hole injection layer, an electron injection layer, or the like, a plurality of functional layers may be sequentially deposited on the first electrode EL1.

The second electrode EL2 may be entirely formed or be patterned to overlap with the emitting layer EML.

Referring to FIG. 3Q, an encapsulation layer TFE may be provided on the second electrode EL2. The encapsulation layer TFE may include an inorganic layer and/or an organic layer. Therefore, an appropriate method of forming the encapsulation layer TFE may be used depending on the kind of the encapsulation layer TFE. For example, when the encapsulation layer TFE has a form in which inorganic and organic layers are alternately stacked in an order of inorganic layer/organic layer/inorganic layer, the process of forming the encapsulation layer TFE may be performed in an order of deposition of the inorganic layer, printing or coating of the organic layer, and deposition of the inorganic layer.

FIGS. 4A to 4D are process sectional views illustrating an electrode forming method according to an embodiment.

Figure 4A:
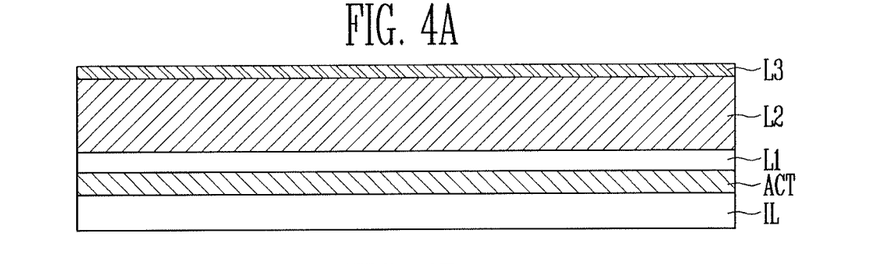
FIGS. 4A to 4D illustrate process sectional views illustrating an electrode forming method according to an embodiment.

Referring to FIG. 4A, a semiconductor layer ACT, a first layer L1, a second layer L2, and a third layer L3 are sequentially provided on an insulating layer IL. Here, the semiconductor layer ACT includes an oxide semiconductor. The semiconductor layer ACT may correspond to the second semiconductor layer ACT2 of FIG. 1. However, the semiconductor layer ACT may be another semiconductor layer including an oxide semiconductor, in addition to the second semiconductor layer ACT2 of FIG. 1.

Similarly, the first to third layers L1 to L3 may be conductive layers for forming the second source electrode SE2 or the second drain electrode DE2 of FIG. 1. However, the first to third layers L1 to L3 may be conductive layers for forming another component except the second source electrode SE2 or the second drain electrode DE2.

The semiconductor layer ACT may be provided using a sputtering method, a plasma enhanced chemical vapor deposition (PECVD) method, a pulsed laser deposition (PLD) method, an atomic layer deposition (ALD) method, a metal organic chemical vapor deposition (MOCVD) method, a solution process of forming a thin film by spin-coating a soluble precursor and then heat treatment on the soluble precursor, a mist CVD method of forming a thin film by spraying a soluble precursor in a mist form, or the like.

The first to third layers L1 to L3 may be provided using different methods for every layer. For example, the first layer L1 may be formed using a sputtering method, and the second layer L2 and the third layer L3 may be formed using a plasma enhanced chemical vapor deposition (PECVD) method. However, when the layers are formed using different methods, several processing chambers are required. Therefore, processing efficiency may be decreased, and processing cost may be increased. Accordingly, the first to third layers L1 to L3 may be formed in the same chamber, using the same method. For example, the first to third layers L1 to L3 may be formed in one deposition chamber, using a plasma enhanced chemical vapor deposition (PECVD) method.

The first to third layers L1 to L3 may have thicknesses different from one another. For example, the thickness of the second layer L2 may be thickest. The thickness of each layer may be adjusted through a process time. For example, the second layer L2 may be formed thicker than the other layers by increasing a deposition process time to be relatively long.

Figure 4B:
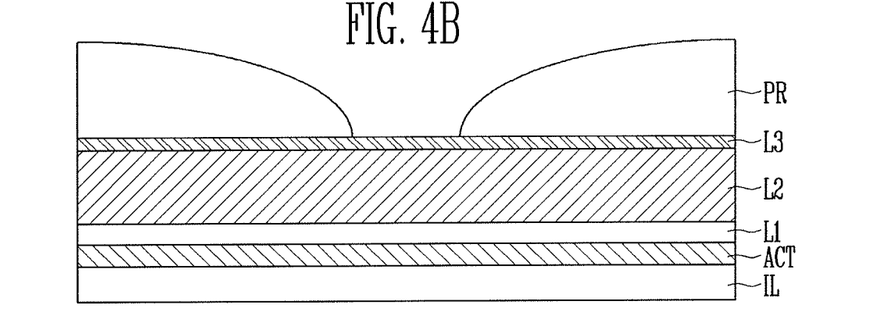

Referring to FIG. 4B, a photoresist PR is provided on the third layer L3. The photoresist PR may remain in a partial region by being entirely coated on the third layer L3 and then being subjected to exposure and development processes.

Figure 4C:
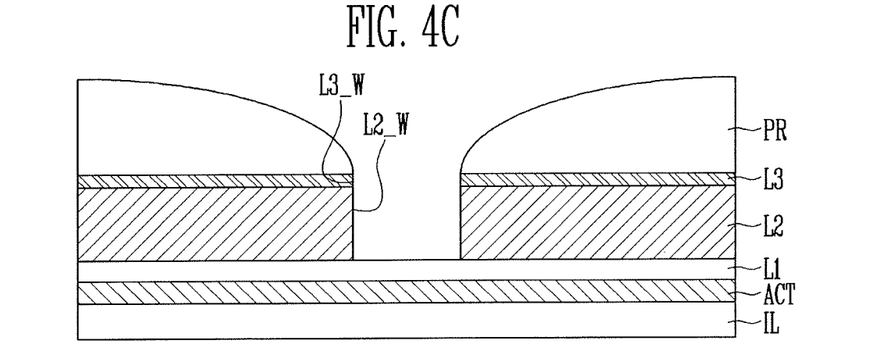

Referring to FIG. 4C, a first etching process is performed after the photoresist PR is provided. The third layer L3 and the second layer L2, which located in a region in which the photoresist PR is not provided, are removed in the first etching process. However, a portion of the first layer L1 may be removed together with the third layer L3 and the second layer L2 in the first etching process.

The first etching process may be performed using a dry etching method. A fluid for etching in a gas state may be used in a dry etching process. The dry etching process may be performed in a vacuum chamber. For example, the state of the fluid for etching may be transformed to a plasma state by providing the first to third layers L1 to L3 and the fluid for etching to the vacuum chamber and applying a voltage to the fluid for etching.

The fluid for etching in the plasma state may create a reaction product in a gas state by reacting with the second layer L2 and the third layer L3. The reaction product is obtained as ions or radicals included in the fluid for etching react with metal atoms, and the state of the reaction product is a gas state. Hence, the reaction product is easily removed from the insulating layer IL.

The fluid for etching, which is used in the first etching process, may include chloride ($Cl_2$) and boron trichloride ($BCL_3$). As a voltage is applied to the chloride ($Cl_2$) and the boron trichloride ($BCL_3$) in the vacuum chamber, the state of the chloride ($Cl_2$) and the boron trichloride ($BCL_3$) may be transformed to a plasma state as follows.

$$Cl_2 + BCl_3 \rightarrow BCl_3^+ + e + Cl \text{ radical} \qquad \text{Chemical Formula 2}$$

The Cl radical creates aluminum chloride or titanium chloride by reacting with aluminum or titanium. Since the aluminum chloride or titanium chloride is in a gas state, the aluminum chloride or titanium chloride is easily removed.

The fluid for etching, which includes chloride ($Cl_2$) and boron trichloride ($BCL_3$), has a high reactivity with the third layer L3 including titanium and the second layer L2 including aluminum. However, the fluid for etching has a low reactivity with the first layer L1 including molybdenum. Therefore, in the first etching process, the second layer L2 and the third layer L3 are etched in a lump, i.e., together, but the first layer L1 is not substantially hardly etched.

Since the third layer L3 and the second layer L2 are etched together in the first etching process, a side part L3_W of the third layer L3 and a side part L2_W of the second layer L2 may be smoothly continued without any step difference.

Figure 4D:
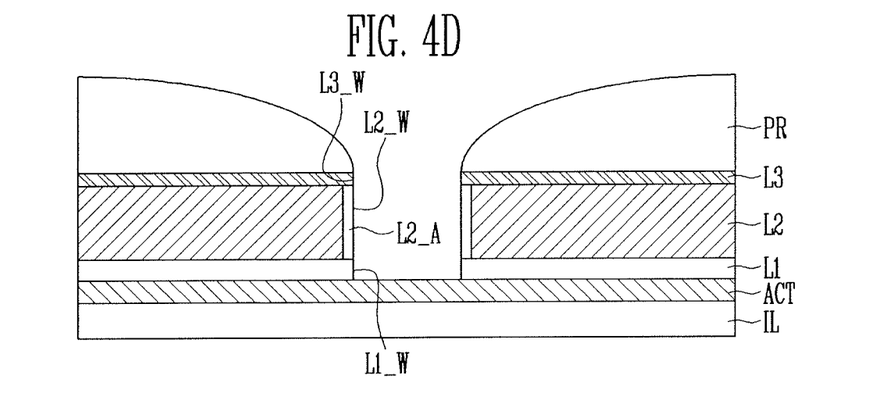

Referring to FIG. 4D, a second etching process is performed, and accordingly, the first layer L1 is etched. A fluid for etching, which is used in the second etching process, may include chloride ($Cl_2$) and oxygen ($O_2$). As a voltage is applied to the chloride ($Cl_2$) and the oxygen ($O_2$) in the vacuum chamber, the state of the chloride ($Cl_2$) and the oxygen ($O_2$) may be transformed to a plasma state. The fluid for etching, which is used in the second etching process, has a low reactivity with titanium. Therefore, the third layer L3 is not influenced by the second etching process.

In addition, the fluid for etching, which is used in the second etching process, does not etch the semiconductor layer ACT including the oxide semiconductor, which is provided on the bottom of the first layer L1. Accordingly, there occurs no problem that electrical characteristics of the semiconductor layer ACT are changed as the semiconductor layer ACT is etched during an electrode patterning process.

The oxygen ($O_2$) included in the fluid for etching, which is used in the second etching process, may serve as a catalyst for helping plasma transformation of the chloride ($Cl_2$). In addition, the oxygen ($O_2$) may react with aluminum included in the side part L2_W of the second layer L2 in the second etching process. Accordingly, an aluminum oxide layer L2_A may be formed at the side part L2_W of the second layer L2 in the second etching process. The aluminum oxide layer L2_A formed at the side part L2_W serves as an outer wall, and the chloride radical reacts with the second layer L2 in the second etching step, so that it is possible to prevent the second layer L2 from being unnecessarily etched. Accordingly, the side part L3_W of the third layer L3, the side part L2_W of the second layer L2, and a side part L1_W of the first layer L1 may be smoothly continued without any step difference. In particular, these side parts L1_W, L2_3, and L3_W may have a tapered shape having one inclination. In addition, when the first to third layers L1 to L3 are included in the second source electrode or the second drain electrode, side parts of the second source electrode and the second drain electrode may have a tapered shape having one inclination.

In addition, the first to third layers L1 to L3 may be applied to another electrode or line that is not shown in FIGS. 1 to 3Q.

As described above, embodiments may provide a display device having improved reliability and a manufacturing method of the display device. In addition, the display device may be stably driven.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. A display device comprising:
   a substrate;
   first and second transistors provided on the substrate to be spaced apart from each other, the first and second transistors being electrically connected to each other; and
   a display unit electrically connected to the first transistor, wherein
   the first transistor includes a first semiconductor layer including crystalline silicon, a first gate electrode, a first source electrode, and a first drain electrode,
   the second transistor includes a second semiconductor layer including an oxide semiconductor, a second gate electrode, a second source electrode, and a second drain electrode, and
   each of the second source electrode and the second drain electrode includes a first layer that includes molybdenum and is provided on the second semiconductor layer, a second layer that includes aluminum and is provided on the first layer, a side layer containing aluminum oxide ($Al_xO_y$) is provided on a side part of the second layer, and a third layer that includes titanium and is provided on the second layer, wherein end surfaces of a side part of the first layer, the side layer containing aluminum oxide and a side part of the third layer are coplanar.

2. The display device of claim 1, further comprising:
   a first insulating layer provided between the first semiconductor layer and the first gate electrode;
   a second insulating layer provided over the first gate electrode; and
   a capacitor electrode provided on the second insulating layer, the capacitor electrode overlapping with the first gate electrode.

3. The display device of claim 1, further comprising a third insulating layer provided between the second semiconductor layer and the second gate electrode, wherein the second source electrode and the second drain electrode are provided on the third insulating layer.

4. The display device of claim 3, wherein:
the first source electrode and the first drain electrode are provided on the third insulating layer, and
each of the first source electrode and the first drain electrode includes a first layer provided on the third insulating layer, a second layer provided on the first layer, and a third layer provided on the second layer.

5. The display device of claim 1, wherein the display unit includes:
a first electrode electrically connected to the first drain electrode;
a second electrode provided on the first electrode; and
an emitting layer provided between the first electrode and the second electrode.

6. The display device of claim 1, wherein the first transistor is a driving transistor, and the second transistor is a switching transistor.

7. The display device of claim 1, wherein:
each of the second source electrode and the second drain electrode makes contact with a respective side surface of the second semiconductor layer, and
a first thickness of each of the second source electrode and the second drain electrode at a distil end above the second semiconductor layer is thinner than a thickness of each of the second source electrode and the second drain electrode at a distil end not above the second semiconductor layer.

8. The display device of claim 1, wherein the second layer of each of the second source electrode and the second drain electrode is pure aluminum or an aluminum alloy.

* * * * *